United States Patent [19]

Wang et al.

[11] 4,412,885

[45] Nov. 1, 1983

[54] MATERIALS AND METHODS FOR PLASMA ETCHING OF ALUMINUM AND ALUMINUM ALLOYS

[75] Inventors: David N. Wang, Cupertino; Frank D. Egitto, Santa Clara; Dan Maydan, Los Altos Hills, all of Calif.

[73] Assignee: Applied Materials, Inc., Santa Clara, Calif.

[21] Appl. No.: 438,786

[22] Filed: Nov. 3, 1982

[51] Int. Cl.³ .............................................. C23F 1/02
[52] U.S. Cl. .................................... 156/643; 156/646; 156/656; 156/659.1; 204/192 E; 252/79.1
[58] Field of Search ............... 156/345, 643, 644, 646, 156/656, 659.1, 665; 204/164, 192 E, 298; 427/38, 39; 252/79.1

[56] References Cited

U.S. PATENT DOCUMENTS 4,267,013  5/1981  Iida et al. .............................. 156/643
4,352,724  10/1982  Sugishima et al. ............. 204/192 E

*Primary Examiner*—William A. Powell
*Attorney, Agent, or Firm*—Flehr, Hohbach, Test, Albritton & Herbert

[57] ABSTRACT

A method for etching a layer of aluminum or aluminum alloy on a semiconductor wafer using the steps:

disposing the wafer on one of a pair of electrode structures in a closed chamber;

communicating into the chamber a reactive gas mixture comprising a principal gas mixture of $BCl_3$ and $Cl_2$ and a dopant gas of oxygen and fluorocarbon gas; and supplying radio frequency electrical energy to one of the electrode structures to create a plasma of the reactive gas mixture for etching the aluminum layer.

17 Claims, 11 Drawing Figures

MATERIALS AND METHODS FOR PLASMA ETCHING OF ALUMINUM AND ALUMINUM ALLOYS

This invention relates generally to reactive gas chemistry for plasma etching of layers of material used in fabrication of semiconductor integrated circuits and to methods for plasma etching of such materials. More specifically, this invention relates to methods for plasma etching of layers of electrically conductive material having aluminum as a principal constituent and to reactive plasma gas chemistry systems for use in such methods.

Integrated circuit (IC) technologies for manufacturing conductor-insulator-semiconductor field effect transistor (CISFET) devices and bipolar transistor devices involve the formation of large numbers of individual transistors and related circuit elements (such as diodes, resistors and capacitors) on each semiconductor chip. A large number of indentical chips are fabricated simultaneously on a semiconductor wafer which is typically processed along with other identical wafers through a sequence of individual and batch processing operations. Over the past several years, the level of integration of devices on individual IC chips has increased dramatically. Important contributors to achieving increased levels of device integration have been improvements in lithography technology and etching technology both of which are at the heart of all semiconductor IC fabrication processes.

Over the past several years improvements in photolithography have resulted in substantial reductions in minimum photolithography feature size. Development of positive photoresist materials, high resolution photomask pattern generation equipment using electron beams, and projection mask alignment and resist exposure systems have reduced minimum photolithography feature size to the 1.0–2.5 micron range. More recently, substantial research and development efforts have been directed to developing ion beam and X-ray lithography systems which show promise in reducing minimum photolithography feature size to submicron dimensions.

While IC device density is determined principally by the resolution of the lithography technology utilized (i.e. minimum photolithography feature size), improvements in resolution of lithography cannot be effectively utilized if the high resolution mask pattern formed in the resist layer cannot be accurately and reproducibly replicated into the underlying layer on the semiconductor wafer by the etching technology utilized. Effective utilization of the resolution of currently available optical photolithography technology is not possible with wet chemical etching systems because of the inherent isotropic nature of the chemical attack of liquid etchants on exposed sections of material layers underlying a patterned photoresist layer. In addition, because of surface tension effects in liquids, wet chemical etchants have difficulty penetrating 1–1.5 micron apertures in a photoresist layer. Furthermore, some of the wet chemical etchants which must be employed for etch selectivity are hazardous due to high toxicity and the possibility of acid burns.

Consequently, substantial research and development has been directed toward the development of plasma etching systems (also called dry etching technology). Plasma etching technology generally holds the promise of providing improvements in directional etching (i.e. anisotropic etching) together with greater safety, since plasma etching equipment generally involves a closed reaction chamber and thus no exposure of processing personnel to dangerous chemicals.

The two basic types of plasma etching systems are described in a co-pending and commonly assigned U.S. patent application entitled "Materials and Methods for Plasma Etching of Oxides and Nitrides of Silicon", Ser. No. 315,133, filed Oct. 26, 1981, now U.S. Pat. No. 4,376,672 and that description is hereby incorporated by reference. Of the different types of plasma etching systems, it is believed that reactive ion etching systems are the preferred systems for achieving high resolution replication of photoresist patterns.

Figure 1:
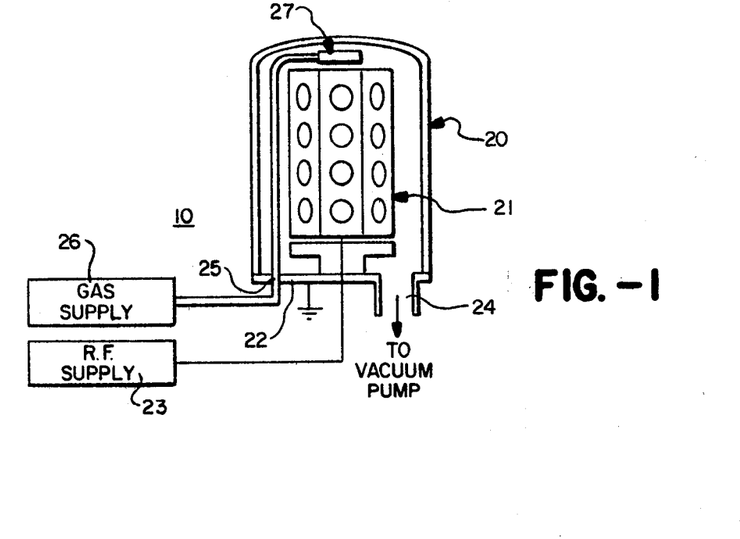
FIG. 1 is a schematic illustration of a reactive ion etching system employing a hexagonal cathode structure and comprising the preferred apparatus for carrying out the method of this invention.

FIG. 1 illustrates schematically a reactive ion etching system 10 which is available commercially from Applied Materials, Inc. of Santa Clara, Ca. The reactive ion etching system 10 utilizes a cylindrical reaction chamber 20 and a hexagonal cathode 21 connected to an RF supply 23. An exhaust port 24 communicates between the interior of reaction chamber 20 and a vacuum pump (not shown). The walls of the reaction chamber 20 and the base plate 22 form the grounded anode of the system. A supply of reactive gas from gas supply 26 is communicated to the interior of the chamber 20 through an entrance port 25 and through a conduit arrangement (not shown) to a gas distribution ring 27 at the top of the chamber. This type of reactive ion etching system forms the preferred apparatus for carrying out the method of this invention.

Figure 2:
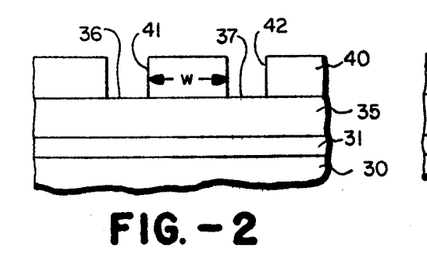
FIGS. 2–3 illustrate the isotropic etch characteristics of wet chemical etching of an aluminum film.
Figure 3:
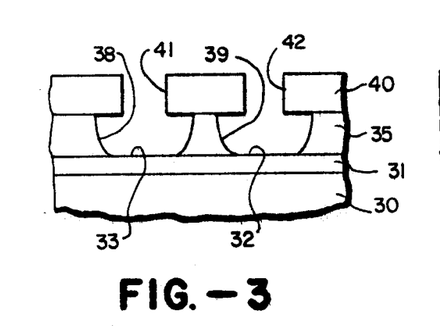
Figure 4:
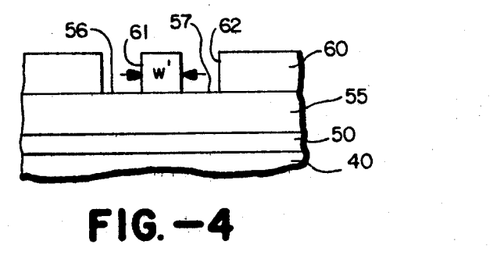
FIGS. 4–5 illustrate the anisotropic etching characteristic which may be achieved in an ion assisted (reactive ion) etching system assuming good etch selectivity with respect to overlying photoresist.
Figure 5:
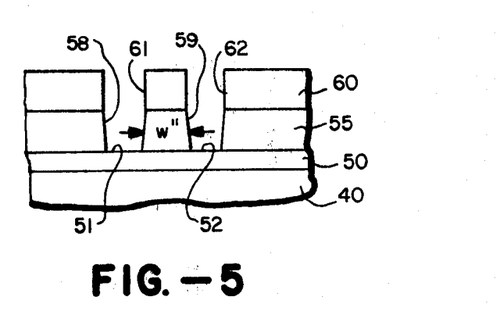

The limitations of wet chemical etching and improvements offered by reactive ion etching systems are illustrated in FIGS. 2–5 of the attached drawings. FIGS. 2 and 3 generally illustrate the isotropy of wet chemical etching technology. FIGS. 4 and 5 generally illustrate the anisotropic (directional) etching characteristic which is the goal of reactive ion etching systems (also called reactive sputter etching systems or ion assisted etching systems).

FIG. 2 illustrates a semiconductor wafer 30 having a layer of insulating material 31 formed on the top surface thereof with an overlying layer of aluminum 35. Overlying aluminum layer 35 is a layer of photoresist 40 which has been patterned to have apertures 41 and 42 therein exposing surface regions 36 and 37 of the aluminum layer 35. For purposes of this illustration, it will be assumed that the minimum photolithography feature size is one micron and that the aluminum layer 35 and the photoresist layer 40 are both about one micron thick. This somewhat artificial arrangement is used for comparative illustration of etching technology and does not necessarily represent actual IC process parameters. It will be noted that the line width W in the photoresist layer 40 is greater than one micron, e.g. about two microns. As will be seen, this increased spacing between apertures 41 and 42 in photoresist layer 40 is required to take into account the isotropy of the wet chemical etch operation. While the example given here is somewhat artificial, it is illustrative of the inability of wet chemical etching technology to take advantage of the minimum photolithography feature size available with current state of the art high resolution lithography systems.

Thus as shown in FIG. 3, the step of wet chemical etching of the aluminum layer 35, using the patterned photoresist layer 40 as an etchant mask, results in general replication of the photoresist mask pattern into the aluminum layer 35 but with substantially enlarged apertures 38 and 39. This is due to the isotropic attack of the wet chemical etchant on the aluminum layer 35 and the general need to perform at least some overetch to be sure to clear the surface of the insulator layer 31 in the exposed regions 32 and 33. In general, wet chemical etching will produce an enlargement in the aperture size at least equal to the thickness of the layer being etched. Overetching produces an even greater enlargement of the replicated aperture size.

FIGS. 4 and 5 illustrate the improvement in replicating the photoresist pattern in photoresist layer 60 into the aluminum layer 55 which is the goal of highly directional reactive ion etching systems currently available on the market, for example the AME 8100 series of plasma etching systems available from Applied Materials, Inc., of Santa Clara, Ca. As shown in FIG. 5, replication of the photoresist apertures 61 and 62 in photoresist layer 60 is accomplished with very high resolution in that apertures 58 and 59 in insulator layer 55 have almost vertical side walls.

The line width W' in photoresist layer 60 has been virtually identically reproduced as a line width W" in the aluminum layer 55. Thus, higher conductor pattern density and greater levels of device integration should be achievable with reactive ion etching. Full realization of the capabilities of ion assisted plasma etching will be imperative for fabrication of very large scale integrated circuit devices.

While FIGS. 4 and 5 generally illustrate the promise of substantial improvement in replicating the photoresist pattern into underlying layers of aluminum which should be achievable using reactive ion etching systems, a number of problems have been encountered in the practical application of this technology to IC fabrication especially in high volume production environments. In particular, substantial problems have been encountered in applying dry etching technology to the patterning of various aluminum and aluminum alloy layers which are used in contact and conductor interconnect systems. In particular, aluminum-copper and aluminum-silicon alloys are frequently used in the critical first metallization layer on the wafer in the processing of semiconductor wafers into integrated circuit chips.

Figure 6:
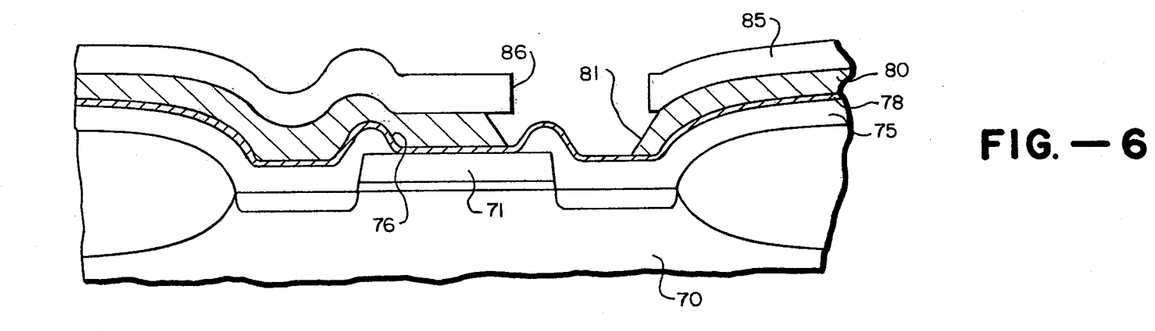
FIG. 6 is fragmented section view illustrating a partial topology of a CISFET device showing one application for reactive ion etching of aluminum films.

One of the applications for patterned layers of aluminum and/or aluminum alloy is illustrated in FIG. 6 which shows a typical polysilicon gate field effect transistor structure. The field effect transistor structure is formed on a semiconductor wafer substrate 70 which includes a gate electrode 71 formed from a layer of polysilicon. The polysilicon gate electrode 71 is typically heavily doped with impurities to render it highly conductive. After the silicon gate 71 is formed, an oxide layer 75 is formed over the entire wafer. Then a polysilicon gate contact aperture 76 is formed in the oxide layer 75 using a separate photolithography step. Next a layer 80 of aluminum is formed over the entire wafer with a region of the layer 80 making contact with the polysilicon gate 71 through the aperture 76 in the oxide layer 75.

In the embodiment shown in FIG. 6 a thin layer of 78 of titanium-tungsten is shown deposited on the oxide layer 75 prior to deposition of the aluminum layer 80. This represents one metallization approach utilizing a sandwich of titanium-tungsten and pure aluminum with the titanium-tungsten layer 78 preventing diffusion of silicon from the gate electrode 71 into the aluminum layer 80.

In other cases the titanium-tungsten layer 78 is not used and a layer 80 of aluminum alloyed with a small amount of silicon (1-2%) may be deposited on the wafer. The silicon in the aluminum alloy inhibits diffusion of the polysilicon from the gate 71 into the aluminum layer. The aluminum layer 80 may also be alloyed with a small amount of copper to enhance electromigration resistance. All of these contact and conductor layer metallurgies are well known in the art and each creates its own set of problems with respect to dry etching of the aluminum layer.

The general requirements for dry etching of aluminum and aluminum alloy layers include reasonably good etch selectivity with respect to the overlying layer of photoresist 85 which is patterned with apertures such as aperture 86 to enable etching of a separation region in the aluminum layer 80. In addition, relatively high etch selectively is required with respect to the titanium-tungsten layer 78 or with respect to both the oxide layer 75 and the polysilicon gate electrode 71 if the titanium-tungsten layer 78 is not present. Ability to control etch edge profile may also be important in applications where two or more layers of aluminum with intervening dielectric layers are formed on the wafer in the multiple level metallization approaches which are often used in IC design. By providing a process which is able to taper the edges 81 of the etched aluminum region, sharp steps in the overlying oxide layer and subsequent metallization layers can be avoided with all of the well known problems associated with such sharp edges.

Figure 7:
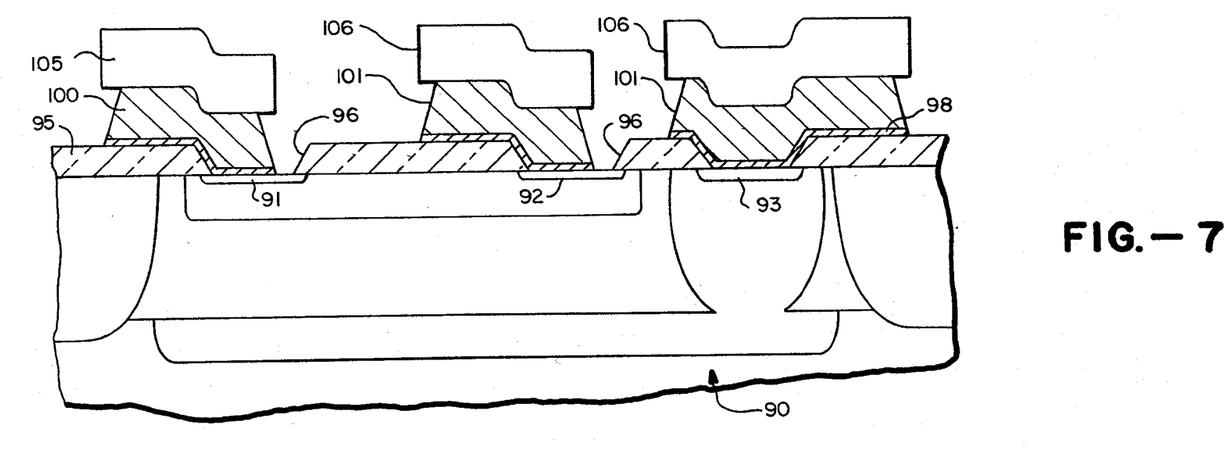
FIG. 7 is a fragmented section view illustrating the partial topology of a bipolar transistor device showing an additional application for reactive ion etching of aluminum films.

FIG. 7 shows another application for a patterned layer of aluminum used to make contact to various doped substrate regions in a bipolar transistor device. In the application shown in FIG. 7 a bipolar transistor is fabricated on a semiconductor substrate 90 and includes a base contact region 91, emitter region 92 and a subcollector contact region 93. Each of these regions is a doped region in the surface of the wafer 90 to which contact by a conductive layer must be made to provide for electrical operation of the transistor device. As shown a layer 95 of silicon oxide or nitride is formed over the surface of wafer 90 and patterned with apertures 96 to enable a subsequent aluminum layer 100 to be formed over the wafer and in contact with the doped regions 91, 92 and 93. FIG. 7 also shows a layer 98 of titanium-tungsten formed over the wafer prior to formation of the aluminum layer 100 as an optional approach to the metallization layer.

Etching of the aluminum layer 100 is accomplished with a patterned masking layer 105 of photoresist and subsequent dry etching of the aluminum layer through the aperture 106 in the photoresist layer 105 to separate the aluminum layer into separate contact regions. Generally the same requirements for dry etching of the aluminum layer 100 pertain in this instance except that good etch selectivity with respect to the doped silicon regions in the wafer 90 is required in the event of misalignment of the contact mask as is illustrated in FIG. 7.

The range of problems which are involved in dry etching of layers of aluminum and aluminum alloys in semiconductor processing are set forth in an article by D. W. Hess entitled "Plasma Etching of Aluminum", *Solid State Technology*, April, 1981, pages 189-194. The principal problems involved in dry etching of aluminum involve achieving a sufficiently high etch rate for good production wafer throughput while retaining adequate selectivity of etching with respect to overlying photoresist and underlying layers. Another problem is obtaining good etch uniformity which is an especially acute problem in dry etching of aluminum and aluminum alloys. Another problem is cleanliness of the etch especially with copper present as an alloy material in the aluminum layer since non-volatile copper compounds tend to contaminate the wafer during etching of an aluminum-copper-silicon layer and require a post treatment process to remove the copper contamination. Another substantial problem involved in dry etching of aluminum is a tendency for the aluminum layer to corrode after the etching processes occur, probably due to chlorine compound residues left on the wafer.

Based on recent investigations the art has generally determined that $BCl_3$ is the preferred etchant for aluminum and aluminum alloy films used as contact and interconnect layers in integrated circuits. The art has also attempted to improve the performance of $BCl_3$ in plasma etching of aluminum and aluminum alloy films by mixing various gases with $BCl_3$. Among the mixtures which have been tried is $BCl_3$ and $Cl_2$. While this approach enhances the etch characteristics of the $BCl_3$ reactant gas, for example by improving the etch rate for the aluminum films, the problems of etch cleanliness, and etch uniformity, especially in the process of etching an aluminum-copper alloy film have not been solved by the gas mixtures taught in the prior art.

Accordingly, it is the principal object of this invention to provide an improved process for plasma etching of a layer of electrically conductive material comprising aluminum as the principal element.

It is the further object of this invention to provide improved reactive plasma gas chemistry systems for use in processes for plasma etching of layers of electrically conductive material comprising aluminum as the principal element.

The above stated objects are achieved by utilizing a reactive gas mixture which comprises a principal gas mixture of $BCl_3$ and $Cl_2$ doped with a small amount of dopant gas mixture comprising $O_2$ and a fluorocarbon gas, the fluorocarbon gas preferably being $CF_4$.

To achieve a sufficient selectivity of etching of aluminum layers with respect to overlying photoresist and thereby to achieve a substantially vertical side wall pattern in the etched layer of aluminum, it is preferable to supply the principal gas mixture and the dopant gas mixture to a reactive ion etching chamber in volumetric ratios of at least about 8:1. On the other hand, where tapered profile control of the etched aluminum layer is desired, the principal gas mixture and the dopant gas mixture may be supplied to the chamber in a volumetric ratio less than 8:1 so that photoresist erosion will be increased. The degree of increase in photoresist erosion can be controlled by the degree to which the ratio of 8:1 is reduced, i.e. by increasing the relative volume of $CF_4$ plus $O_2$ supplied in the total reactive gas mixture.

In accordance with this invention, the relative volumetric ratios between the principal gas mixture and the dopant gas mixture may be controlled for purposes of optimizing etch performance for various compositions of the aluminum layer. In addition, it has been found that chamber pressure and RF energy may be optimized for reactive ion etching of the various types of aluminum layers.

The principal advantage of utilizing a dopant gas mixture of $CF_4$ plus $O_2$ with $BCl_3$ and $Cl_2$ is that a substantial improvement in etch rate is achieved simultaneously with substantial improvements in etch uniformity. Achievement of such improvements is especially dramatic in the etching of aluminum-copper alloy layers with the reactive gas mixture of this invention also providing a very clean etch with no copper residue and eliminating the necessity for post-etch plasma treatment or wet chemical removal of copper residues. Improvement in etching of the aluminum and aluminum alloy layers is achieved without substantial adverse affect on etch selectivity and other important performance factors.

Other objects, features, and advantages of this invention will be apparent from a consideration of the following detailed description taken in conjunction with the accompanying drawings.

The dry etching methodology and plasma gas chemistry of this invention are based on the discovery that adding a dopant gas mixture comprising a fluorocarbon gas and oxygen to a principal reactive gas mixture of $BCl_3$ and $Cl_2$ substantially improves the performance of dry etching of aluminum and aluminum alloy films by substantially improving etch rate and etch uniformity without significantly degrading etch selectivity over photoresist masking materials. Utilizing this reactive gas chemistry provides for the first time a process capable of etching aluminum-copper alloy layers in a single process step without leaving copper residues which would otherwise require a separate post-etch plasma treatment or wet chemical removal treatment. It has also been discovered that the use of the reactive gas chemistry of this invention reduces the tendency of the etched aluminum layer to corrode. The reasons for such reduced corrosion are not clear but may be related to the formation of a protective layer of $AlF_3$ which would prevent corrosion of the surface of the aluminum layer. Improvements in etch uniformity may be attributive to the contribution of the $CF_4$ plus $O_2$ dopant gas mixture providing a strong assist in cleaning native aluminum oxide from the surface of the wafer so that subsequent etching of the aluminum layer itself can proceed more directly and consistently across the total surface of the wafer.

Figure 8:
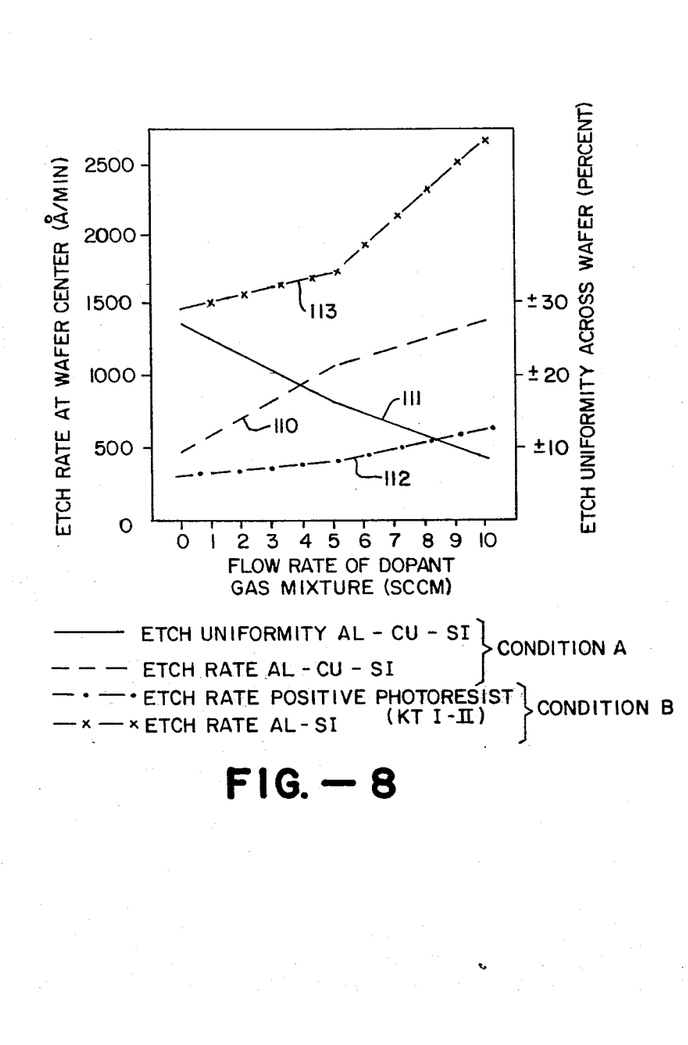
FIGS. 8–11 are graphs useful in illustrating the performance of the dry etching method and reactive plasma gas chemistry systems in accordance with this invention.

FIG. 8 illustrates the improvement in etch rate and etch uniformity which is achieved by adding increasing amounts of a dopant gas mixture of 90% $O_2$ and 10% $CF_4$ to a mixture of $BCl_3$ and $Cl_2$. Curve 110 shows the variation in etch rate as a function of flow rate of the dopant gas mixture for etching an aluminum alloy film with 4% copper and 1% silicon under the following etching conditions in an AME 8100 series plasma etching system available from Applied Materials Corporation of Santa Clara, Ca.: 60 SCCM BCl$_3$, 20 SCCM CL$_2$, 10 SCCM He, a chamber pressure of 10 millitorr, power of 1,100 watts for a power density of about 0.2 watts/cm$^2$. Curve 111 shows the corresponding etch uniformity as a function of dopant gas flow rate under the same etch process conditions.

Curve 113 shows the variation in etch rate with dopant gas flow rate for aluminum alloy film containing 2% silicon under the following etch conditions: 115 SCCM BCl$_3$, 33 SCCM Cl$_2$, chamber pressure of 60 millitorr, applied power of 1,200 watts for a power density of about 0.22 watts/cm$^2$. Curve 112 shows the corresponding etch rate of positive photoresist as a function of dopant gas flow rate under the same etch conditions. Improvements in etch uniformity of the aluminum-silicon alloy layer are comparable to the improvement in etch uniformity for the aluminum-copper-silicon layers shown in curve 111.

The graphs of FIG. 8 thus show that the etch rate of aluminum alloy films can be substantially increased with accompanying improvements in etch uniformity without adversely effecting the selectivity over photoresist provided the flow rate of dopant gas mixture is maintained below about 10 SCCM. In other words, good etch and anisotropy can be achieved because of substantial selectivity of etch of the aluminum alloy layers over overlying photoresist if the flow rate of the dopant and gas mixture is maintained below this level. However, to provide profile control for the etched aluminum layer, it is possible to increase the flow rate of the dopant gas mixture to favor etching of the photoresist layer and thereby provide a tapered edge profile for the aluminum film. This tailoring of the etch profile of the etched layer of aluminum is an important feature of this invention. In other words, the edge profile may be varied from substantially vertical to about 45 degrees to the vertical by varying the relative volumetric concentration ratios between the principal gas mixture and dopant gas mixture. Although not shown in FIG. 8, further increases in the flow rate of the dopant gas mixture tends to more substantially increase the etch rate for photoresist than for aluminum.

Figure 9:
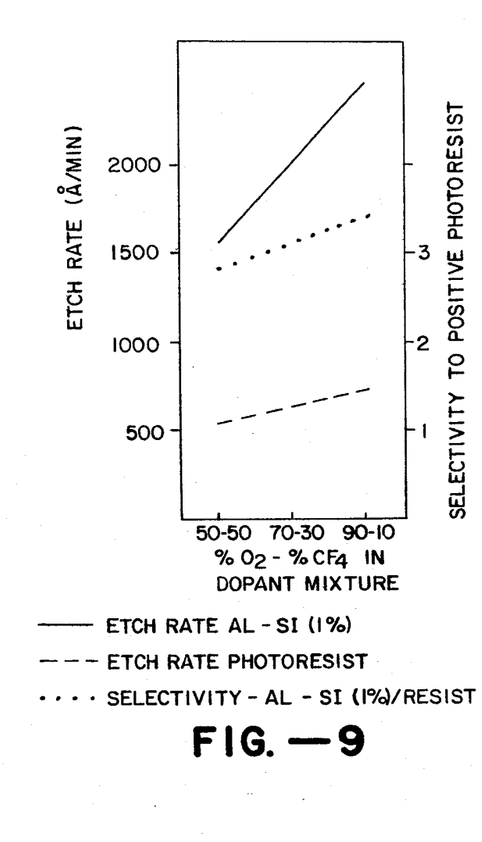

The use of a 10% CF$_4$ and 90% ratio as the dopant gas mixture provides optimum etch rate and etch selectivity to positive photoresist. FIG. 9 presents etch rate and selectivity data as a function of O$_2$/CF$_4$ dopant ratio. This data was taken using the following operating parameters: flow rates for BCl$_3$ Cl$_2$ and dopant mixture of 115, 33 and 10SCCM, respectively, 1200 watts of power and pressure of 60 millitorr. However, the dopant gas ratio (i.e. the ratio between O$_2$ and CF$_4$) does influence other etch parameters such as etch anisotropy and the formation of residues. Typically decreasing the dopant gas ratio increases anisotropy and reduces the formation of residues. The selection of the optimum dopant gas ratio is a function of the photoresist and etch rate used. Typical the optimum ratio is between 50–50 and 90–10.

Figures 10, 11:
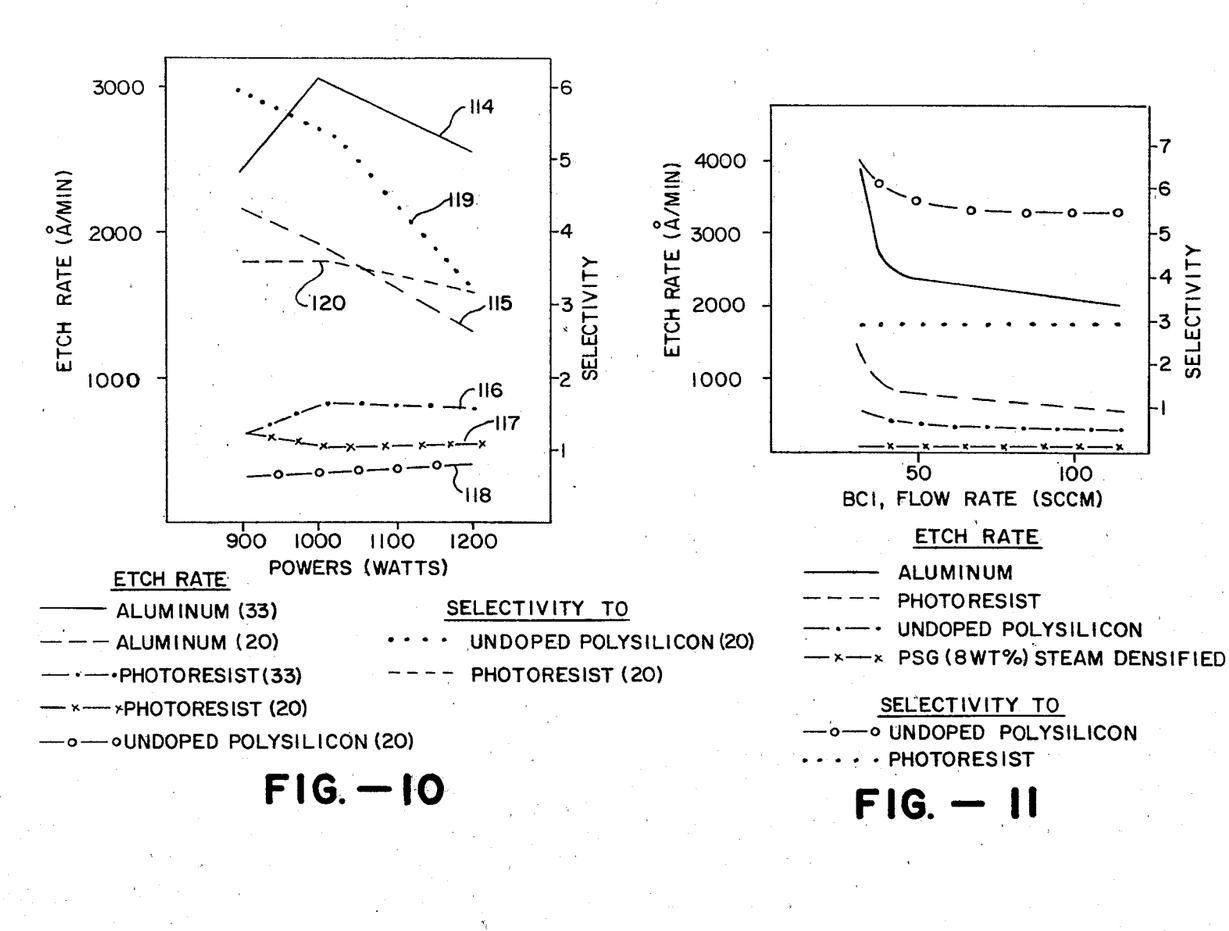

FIG. 10 illustrates the etch rates of various layers of aluminum, photoresist and undoped polysilicon at various power settings and also illustrates etch selectivity over undoped polysilicon and photoresist at various power settings. The process conditions used in producing the data shown in FIG. 10 were the following: 115 SCCM BCl$_3$, 10 SCCM dopant gas, chamber pressure of 60 millitorr, and power setting of 1,200 watts corresponding to a power density of about 0.22 watts/cm$^2$. The material etched is aluminum without any intentional addition of alloyed materials. Curve 114 shows the etch rate for aluminum as a function of power with a flow rate of Cl$_2$ of 33 SCCM. Curve 115 illustrates the etch rate of aluminum versus power setting with a 20 SCCM flow rate of Cl$_2$. Curves 116 and 117 illustrate the respective etch rates for photoresist as a function of power setting for Cl$_2$ rates of 33 SCCM and 20 SCCM respectively. Curve 118 illustrates the etch rates for undoped polysilicon as a function of power setting with the flow rate of Cl$_2$ at 20 SCCM.

Curve 119 shows the etch selectivity for aluminum over undoped polysilicon at a Cl$_2$ flow rate of 20 SCCM and curve 120 shows the etch selectivity of aluminum over photoresist at a Cl$_2$ flow rate of 20 SCCM. Experimental data concerning the etch rate of doped polysilicon shows a selectivity of greater than 16:1. Although not shown in FIG. 10, experimental data shows that satisfactory etch performance on pure aluminum films can be achieved down to reactor power settings as low as 600 watts and the total range of useful power densities is about 0.07–0.22 watts/cm$^2$. Generally for etching of aluminum-copper and aluminum-silicon alloy films, the higher power settings in the range of 0.18–0.22 watts/cm$^2$ are preferred to achieve relatively high etch rates whereas for etching of pure aluminum the power settings in the lower portion of the range are preferred since substantial etch rates are achieved and higher etch selectivity can be maintained.

FIG. 11 illustrates the variations in etch rates and selectivity as a function of the flow rate of BCl$_3$ under conditions where the flow rate of Cl$_2$ is 33 SCCM. The flow rate of a 90% O$_2$–10% CF$_4$ dopant gas is 10 SCCM, the reactor pressure is 60 millitorr and the power setting is 1200 watts. For overall etch performance, it has been determined that the principal gas mixture preferably should have a BCl$_3$ content in the range of about 60% to about 80% by volume.

To develop the data shown in the graphs of FIGS. 8–11 and to characterize the overall results achievable using a principal gas mixture of BCl$_3$ and Cl$_2$ together with the dopant mixture of CF$_4$ and O$_2$, experiments using various gas flow rates, power settings and reactor pressure settings were performed. Out of these experiments, it was determined that useful results could be achieved in at least some of the aluminum etching applications described above over the ranges of operating parameters shown in Table I below. These ranges of operating parameters are for the AME 8100 reactive ion etching system. This system has a chamber volume of about 160 liters. Accordingly, the flow rates given in Table I can readily be transferred to other types of reactive ion etching systems by correlating the flow rate per unit chamber volume of each of the reactive gases.

Table II below gives the preferred range of process parameters for etching an aluminum alloy layer having both copper and silicon constituents in the layer.

Typically, 4% copper and 1% silicon are utilized in aluminum-copper-silicon alloy layers. The parameters set forth in Table II are for anisotropic etching of the aluminum-copper-silicon layer. To provide for a sloped edge wall in the etched aluminum layer, the flow rate of the dopant mixture may be increased to favor photoresist erosion. The gas flow rates set forth in Table II are specified with respect to the AME 8100 system, but may be readily converted to other systems utilizing a flow rate per unit volume correlation.

TABLE I

| PARAMETER | RANGE |
|---|---|
| RF Power Density | 0.07–0.22 watts/cm$^2$ |
| Reactor Chamber Pressure | 10–70 millitorr |
| Total Flow Rate | 50–200 SCCM |
| Residence Time | 0.5–20 seconds |
| Gas Flow Rates | |
| Dopant Mixture | 1–20 SCCM |
| BCl$_3$ | 30–115 SCCM |
| Cl | 20–40 SCCM |
| Background gas (He,Ar,etc.) | 0–20 SCCM |

TABLE II

| PARAMETER | RANGE |
|---|---|
| RF Power Density | 0.18–0.22 watts/cm$^2$ |
| Reactor Chamber Pressure | 10–40 millitorr |
| Total Flow Rate | 75–135 SCCM |
| Residence Time | 1–7 seconds |
| Gas Flow Rates | |
| Dopant Mixture | 5–20 SCCM |
| BCl$_3$ | 50–70 SCCM |
| Cl$_2$ | 15–25 SCCM |
| Background | 0–20 SCCM |

Table III below sets forth the preferred parameters for etching an aluminum-silicon alloy film and Table IV gives the preferred parameters for etching of an aluminum film without any alloying materials therein. The background gas may be any of the well known gases utilized for this purpose, such as helium and argon, which do not enter into the plasma etching reaction but have the benefit of increasing plasma stability which results in better uniformity of etching. Other fluorocarbon gases such as CHF$_3$ and C$_2$F$_6$ and C$_3$F$_8$ could also be utilized in the dopant gas mixture.

Table V below gives typical etch results achieved using the preferred process parameters set forth above in Tables II–IV.

TABLE III

| PARAMETER | RANGE |
|---|---|
| RF Power Density | 0.18–0.22 watts/cm$^2$ |
| Reactor Chamber Pressure | 5–70 millitorr |
| Total Flow Rate | 125–195 SCCM |
| Residence Time | 1.5–7 seconds |
| Gas Flow Rates | |
| Dopant Mixture | 5–20 SCCM |
| BCl$_3$ | 95–115 SCCM |
| Cl$_2$ | 20–40 SCCM |
| Background | 0–20 SCCM |

TABLE IV

| PARAMETER | RANGE |
|---|---|
| RF Power Density | 0.07–0.18 watts/cm$^2$ |
| Reactor Chamber Pressure | 25–70 millitorr |
| Total Flow Rate | 120–195 SCCM |
| Residence Time | 1.5–7.0 seconds |
| Gas Flow Rates | |
| Dopant Mixture | 5–20 SCCM |
| BCl$_3$ | 95–115 SCCM |
| Cl$_2$ | 20–40 SCCM |
| Background | 0–20 SCCM |

TABLE V

| LAYER MATERIAL | Etch Rate (A/min.) | SELECTIVITIES | | |
|---|---|---|---|---|
| | | PSG | Undoped Polysilicon | Resist |
| Al-4% Cu-1% Si | 800 | 15:1 | 3:1 | 3:1 |
| Al-2% Si | 1000 | 20:1 | 5:1 | 3.5:1 |
| Aluminum | 1500 | 30:1 | 7:1 | 4:1 |

From the above description, it should be apparent that the plasma etching method and reactive gas chemistry system of this invention provides a number of advantages over prior art systems for etching of aluminum and aluminum alloy layers. A substantial improvement in etch rate with concomitant improvement in etch uniformity provides improved wafer throughput and higher yields in semiconductor processing. These results are achieved while simultaneously maintaining good selectivity with respect to underlying and overlying layers. In addition, etch side wall profile control is easily achievable by manipulating the volume percentage of the dopant gas mixture with respect to the principal gas mixture of BCl$_3$ and Cl$_2$.

While this invention has been described above in connection with various preferred and alternative embodiments of plasma etching method and reactive gas chemistry, it should be understood that persons of skill in this art could make numerous modifications therein without departing from the scope of this invention as claimed in the following claims.

What is claimed is:

1. In a method for etching a layer of electrically conductive material formed on a semiconductor wafer and comprising aluminum as the principal element, the steps of:

disposing said wafer on one of a pair of electrode structures in a closed chamber;

communicating into said chamber a reactive gas mixture comprising a principal gas mixture of BCl$_3$ and Cl$_2$ doped with a small amount of dopant gas mixture of O$_2$ and a fluorocarbon gas; and supplying radio frequency electrical energy to one of said electrode structures to create a plasma of said reactive gas mixture for etching said electrically conductive material.

2. The method of claim 1, wherein O$_2$ is the predominant component of said dopant gas mixture.

3. The method of claim 1, wherein said wafer is disposed on the cathode within the closed chamber of a reactive ion etching system; and said dopant gas mixture comprises at least about 90% by volume of O$_2$.

4. The method of claim 3, wherein said chamber is maintained at a pressure in the range of about 10–70 millitorr, said radio frequency energy is supplied at a power level which creates a power density in the range of about 0.05–0.25 watts/cm$^2$, said principal gas mixture and said dopant gas mixture are supplied to said chamber in volumetric ratios between about 5:1 to 50:1, and said principal gas mixture has a BCl$_3$ content in the range from about 50% to about 80% by volume.

5. The method of claim 4, wherein said reactive gas mixture is supplied to said chamber at total gas flow rates sufficient to provide a residence time of said reactive gas mixture in the range of about 0.5–20 seconds.

6. The method of claim 3, adapted for etching substantially vertical side-wall patterns into said layer of conductive material in the presence of an overlying patterned layer of organic photoresist material to expose corresponding regions of underlying layers of materials such as silicon, doped or undoped polysilicon, oxides and nitrides of silicon, and titanium-tungsten, wherein said principal gas mixture and said dopant gas mixture are supplied to said chamber in volumetric ratios of at least about 8:1.

7. The method of claim 6, adapted for etching a layer of conductive material comprising aluminum alloyed with a small amount of copper and silicon, wherein said principal gas mixture and said dopant gas mixture are supplied to said chamber in volumetric ratio between about 8:1 and 10:1, said principal gas mixture has a $BCl_3$ content in the range from about 50% to about 80% by volume; said chamber is maintained at a pressure in the range of about 10–40 millitorr, said RF energy is supplied at a power level which creates a power density in the range of about 0.18–0.22 watts/cm$^2$, and said reactive gas mixture is supplied to said chamber at a total flow rate which produces a residence time of activated species in the range of about 1.0 to 7.0 seconds.

8. The method of claim 6, adapted for etching a layer of conductive material comprising aluminum alloy with a small amount of silicon, wherein said principal gas mixture and said dopant gas mixture are supplied to said chamber in volumetric ratio between about 10:1 and 20:1, said principal gas mixture has a $BCl_3$ content in the range of about 50% to 80% by volume; said chamber is maintained at a pressure in the range of about 25–70 millitorr; said radio frequency energy is supplied at a power level which creates a power density in the range of about 0.18–0.22 watts/cm$^2$; and said reactive gas mixture is supplied to said chamber at a total flow rate which produces a residence time of activated gas species in a range of about 1.5 to 7.0 seconds.

9. The method of claim 6, adapted for etching a layer of conductive material comprising substantially pure aluminum, wherein said principal gas mixture and said dopant gas mixture are supplied to said chamber in volumetric ratio between about 10:1 and about 20:1, said principal gas mixture has a $BCl_3$ content in the range from about 50% to about 80% by volume; said chamber is maintained at a pressure in the range of about 25–70 millitorr; said radio frequency energy is supplied at a power level which creates a power density in the range of about 0.07 to 0.18 watts/cm$^2$; and said reactive gas mixture is supplied to said chamber at a total gas flow rate which produces a residence time of activated gas species in the range of about 1.5 to 7.0 seconds.

10. The method of claim 3, adapted for etching tapered side wall patterns into said layers of conductive material in the presence of an overlying patterned layer of organic photoresist material to expose corresponding regions of underlying layers of materials such as silicon, oxides or nitrides of silicon, and titanium-tungsten, wherein said principal gas mixture and said dopant gas mixture are supplied to said chamber in a volumetric ratio of less than 8:1.

11. The method for operating a reactive ion etching system for high resolution, highly uniform replication of a pattern of apertures in a layer of organic photoresist into an underlying layer of electrically conductive material formed on a semiconductor wafer and having aluminum as the principal constituent, the method producing anisotropic etching without formation of nonvolatile reaction products and with substantial etch rate selectivity for the conductive material over the photoresist material and over underlying layers of material which may comprise one or more of silicon, oxides and nitrides of silicon and alloys of titanium and tungsten; the method comprising:

disposing said wafer on the cathode structure within the chamber of said reactive ion etching system; supplying to said chamber a reactive gas mixture comprising a principal gas mixture of $BCl_3$ and $Cl_2$ doped with a small amount of a dopant gas mixture of $O_2$ and a fluorocarbon gas, with $O_2$ the predominant constituent of said dopant gas mixture; and supplying radio frequency energy to said cathode structure to create a plasma of said reactive gas mixture.

12. The method of claim 11, wherein said chamber of said reactive ion etching system is maintained at a pressure in the range of about 10–70 millitorr; said radio frequency energy is supplied at a power level which creates a power density in the range of about 0.05–0.25 watts/cm$^2$; said principal gas mixture and said dopant gas mixture are supplied to said chamber in volumetric ratios between about 5:1 to 50:1; said principal gas mixture has a $BCl_3$ content in the range of about 50% to about 80% by volume; and said reactive gas mixture is supplied to said chamber at a flow rate sufficient to provide a residence time of said reactive gas mixture in the range of about 0.5 to 20 seconds.

13. A reactive gas mixture adapted for plasma etching of a layer of electrically conductive material comprising aluminum as the principal element at relatively high etch rates and with substantial etch rate selectivity for overlying materials such as photoresist and underlying materials such as silicon, oxides and nitrides of silicon and alloys of titanium and tungsten, said mixture comprising a principal gas mixture of $BCl_3$ and $Cl_2$ doped with a small amount of a dopant gas mixture of $O_2$ and a fluorocarbon gas with $O_2$ the predominant constituent of said dopant gas mixture.

14. A reactive gas mixture of claim 13, adapted for anisotropic etching of said layer of electrically conductive material in a reactive ion etching system, wherein said fluorocarbon gas is $CF_4$ and said principal gas mixture and said dopant gas mixture are supplied to the chamber of said reactive ion etching system and volumetric ratio of at least about 8:1.

15. The reactive gas mixture of claim 14, adapted for etching a layer of conductive material comprising an alloy of aluminum with small amount of copper or copper and silicon, wherein said principal gas mixture and said dopant gas mixture are supplied to said chamber in volumetric ratio between about 8:1 and 10:1 and said principal gas mixture has a $BCl_3$ in the range from about 50% to about 80% by volume, said chamber is maintained at a pressure in the range of about 10–40 millitorr, said RF energy is supplied at a power level which creates a power density in the range of about 0.18–0.22 watts/cm$^2$, and said reactive gas mixture is supplied to said chamber at a total flow rate which produces a residence time of activated species in the range of about 1.0 to 7.0 seconds.

16. The reactive gas mixture of claim 14, adapted for etching a layer of conductive material comprising an alloy of aluminum with silicon or substantially pure aluminum, wherein said principal gas mixture and said dopant gas mixture are supplied to said chamber in volumetric ratio between about 10:1 and 20:1; and said principal gas mixture has a $BCl_3$ content in the range from about 50% to about 80% by volume, said chamber is maintained at a pressure in the range of about 25-70 millitorr; said radio frequency energy is supplied at a power level which creates a power density in the range of about 0.18-0.22 watts/cm$^2$; and said reactive gas mixture is supplied to said chamber are a total flow rate which produces a residence time of activated gas species in a range of about 1.5 to 7.0 seconds.

17. The reactive gas mixture of claim 13, adapted for etching tapered side wall apertures into said layer of conductive material in the presence of an overlying patterned layer of organic photoresist material, wherein said fluorocarbon gas is $CF_4$, and said principal gas mixture and said dopant gas mixture are supplied to said chamber in volumetric ratios of less than 8:1.

* * * * *